United States Patent
Codding et al.

(10) Patent No.: US 7,498,236 B2
(45) Date of Patent: Mar. 3, 2009

(54) SILICON WAFER THINNING END POINT METHOD

(75) Inventors: Steven R. Codding, Underhill Center, VT (US); Timothy C. Krywanczyk, Essex Junction, VT (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 11/563,715

(22) Filed: Nov. 28, 2006

(65) Prior Publication Data

US 2008/0124896 A1     May 29, 2008

(51) Int. Cl.
*H01L 21/30*    (2006.01)
*H01L 21/46*    (2006.01)
*H01L 21/306*   (2006.01)
*C23F 1/00*     (2006.01)

(52) U.S. Cl. .............................. 438/459; 257/E21.237; 156/345.13; 156/345.25

(58) Field of Classification Search .......... 257/E21.237; 156/345.13, 345.25; 438/459
See application file for complete search history.

(56) References Cited

U.S. PATENT DOCUMENTS

| | | | |
|---|---|---|---|
| 5,240,552 A | 8/1993 | Yu et al. |
| 5,265,378 A | 11/1993 | Rostoker |
| 5,503,707 A | 4/1996 | Maung et al. |
| 5,643,048 A | 7/1997 | Iyer |
| 6,171,873 B1 | 1/2001 | Mendelson et al. |
| 6,503,839 B2 | 1/2003 | Gonzales et al. |
| 6,586,337 B2 | 7/2003 | Parikh |
| 6,635,512 B1 * | 10/2003 | Hikita et al. ............... 438/113 |
| 6,672,943 B2 | 1/2004 | Vogtmann et al. |
| 6,743,722 B2 | 6/2004 | Kassir |
| 6,813,534 B2 | 11/2004 | Sui et al. |
| 6,887,126 B2 | 5/2005 | Brouillette et al. |
| 6,930,023 B2 | 8/2005 | Okada et al. |
| 7,040,958 B2 | 5/2006 | Gan et al. |
| 7,050,880 B2 | 5/2006 | de Roover et al. |
| 2002/0102920 A1 | 8/2002 | Vogtmann et al. |
| 2003/0027501 A1 | 2/2003 | Arai |
| 2003/0143861 A1 | 7/2003 | Kassir |
| 2004/0198196 A1 | 10/2004 | Walsh et al. |
| 2005/0221722 A1 | 10/2005 | Cheong |

FOREIGN PATENT DOCUMENTS

JP          09069501    *    3/1997

* cited by examiner

*Primary Examiner*—Zandra Smith
*Assistant Examiner*—Daniel Luke
(74) *Attorney, Agent, or Firm*—Scully, Scott, Murphy & Presser, P.C.; William H. Steinberg, Esq

(57) ABSTRACT

Disclosed are a method of and system for fabricating a semiconductor wafer. The method comprises the steps of providing a silicon wafer having a front side an a back side, building an integrated circuit on the front side of the wafer, and thereafter removing substrate from the back side of the silicon wafer. The building step includes the steps of forming a desired structure in the wafer, and forming an end structure in the wafer, said end structure extending to a greater depth, toward the back side of the wafer, than the desired structure. Also, the removing step includes the step of removing said substrate only to the end structure, whereby no part of the desired structure is removed during the removing step.

3 Claims, 2 Drawing Sheets

SILICON WAFER THINNING END POINT METHOD

BACKGROUND OF THE INVENTION

1. Field of the Invention

The present invention generally relates to integrated circuit manufacture, and more specifically, the invention provides a method and system for providing an end point for silicon wafer thinning.

2. Background Art

The use of semiconductor devices in today's commercial goods is undergoing dramatic growth. In order to expand the use of semiconductor devices, these devices must be produced at previously unattainable low cost and with smaller size active devices and smaller line widths. Virtually every step of semiconductor device production is undergoing extensive investigation in an effort to obtain efficiencies and cost savings that will expand the market for semiconductor products.

One of the areas of semiconductor production that receives continuous attention is miniaturization of the devices. In the production of semiconductor devices such as IC cards, solar cells and thin film transistors or semiconductor integrated circuits, miniaturization of devices or degree of freedom concerning use thereof can be improved by making the thickness of semiconductor wafers used as substrates therefor sufficiently thinner.

In a conventional technique, in order to produce a thin semiconductor wafer, semiconductor devices (circuit patterns) are formed on a surface of a mirror-polished semiconductor wafer, then a protective tape is adhered on the surface, the wafer is placed on a chuck table of grinding apparatus with the surface side as the underside, and the back surface of the wafer is ground with a grinding stone to thin the wafer.

The usual thickness of the semiconductor wafer generally varies depending on its diameter and, for example, it is about 625 μm for a wafer having a diameter of 5 inches (125 mm) or 6 inches (150 mm) or about 725 μm for a wafer having a diameter of 8 inches (200 mm). Also, although the thickness after thinning may vary depending on types of semiconductor devices to be produced, that thickness is generally about 150-400 μm.

One important challenge that is faced when thinning the wafers is that, if a wafer is thinned too much, structures that were formed in the wafer may be damaged. One way to address this challenge is to determine beforehand, by using test or sacrificial wafers, the extent to which the backsurface of the wafer should be ground away. This, however, is not a completely satisfactory solution because wafers can vary in thickness. Thus, grinding off a predetermined thickness may result in some wafers being damaged. As a result, varying depth of thickness is needed to achieve proper silicon removal.

SUMMARY OF THE INVENTION

An object of this invention is to improve methods for thinning silicon wafers.

Another object of the present invention is to use a structure in a wafer to create an end point for wafer thinning.

A further object of the invention is to allow for repeatable wafer structures, after backsurface grinding, regardless of wafer, quartz or grind tape variations.

Another object of this invention is to achieve repeatable wafer thinning, regardless of wafer, quartz or grind tape variations, without the need for sacrificial wafers to determine and control the process.

These and other objectives are attained with a method of and system for fabricating a semiconductor wafer. The method comprises the steps of providing a silicon wafer having a front side and a back side, building an integrated circuit on the front side of the wafer, and thereafter removing substrate from the back side of the silicon wafer.

The building step includes the steps of forming a desired structure in the wafer, and forming an end structure in the wafer, with said end structure extending to a greater depth, toward the back side of the wafer, than the desired structure. Also, the removing step includes the step of removing said substrate only to the end structure, whereby no part of the desired structure is removed during the removing step.

In a preferred embodiment, the removing step includes the further steps of grinding away said substrate by using a grinding wheel, and stopping said grinding when the grinding wheel reaches said end structure. For example, the end structure itself may be used to stop the grinding wheel when that wheel reaches the end structure. Also, that end structure may, for instance, be made of tungsten or copper.

Further benefits and advantages of this invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
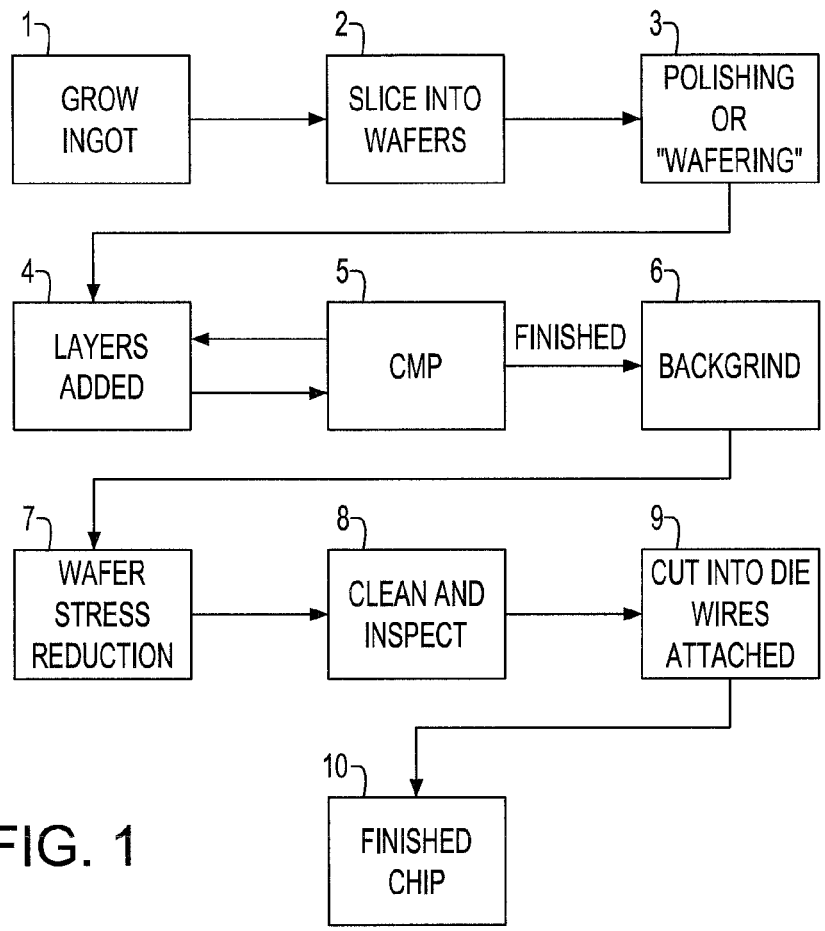
FIG. 1 is a diagram illustrating a procedure, incorporating the present invention, for producing integrated chips.

FIG. 1 illustrates a procedure for producing integrated chips and incorporating teachings of the present invention. In step 1, silicon is purified and cast into electronic-grade ingots. The ingots are then converted into high purity, single crystal silicon by growing a crystal silicon structure. In step 2, the ingot is sliced into wafers using a diamond saw, with each wafer being approximately ¹⁄₄₀" thick. In step 3, each wafer is polished, lapped smooth, damage decorated with acid to reveal hidden defects, and may be ground either over the wafer surface or at its edges. After the polishing processing, also known as wafering, is complete the new prime wafer is ready to have integrated circuits built upon it.

In steps 4 and 5, integrated circuits are built onto the front side of the wafer. In step 4, at least one layer of material is deposited onto the silicon wafer substrate. Then, in step 5, a CMP process is applied to the layer in order to ensure a very flat surface, to enhance photolithographic abilities, to improve metal wiring quality, to enhance step coverage, and to realize other advantages. The result is many integrated circuits deposited on a silicon substrate. Steps 4 and 5 are repeated as necessary until the desired number and types of layers are reached and a complicated plurality of integrated circuits is built up on the front side of the wafer.

Figure 2:
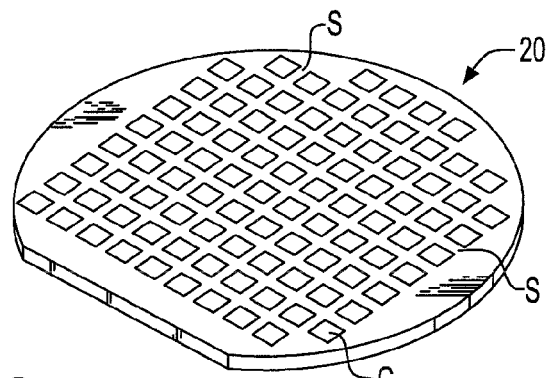
FIG. 2 shows a wafer formed in the procedure of FIG. 1

FIG. 2 shows the wafer 20 at this point in the process. As shown in the Figure, the wafer has a plurality of crossing streets S formed on the front side of the wafer, and each square section C has a circuit pattern formed therein.

With reference again to FIG. 1, at step 6 of the procedure, the bulk of the silicon substrate is removed from the back side of the wafer in a process known as backgrinding. In step 7, the wafer is processed to relieve surface stress on the backside of the wafer. In step 8, the newly etched wafer is rinsed and dried. It is also inspected for unwanted defects. In step 9, the wafer is cut into individual die. Each die is an individual integrated circuit chip. Attaching wires to pre-determined locations on the integrated circuit chip then processes each die. In step 10, the new integrated circuit chips are tested and then encapsulated into ceramic or plastic enclosures.

Figure 3:
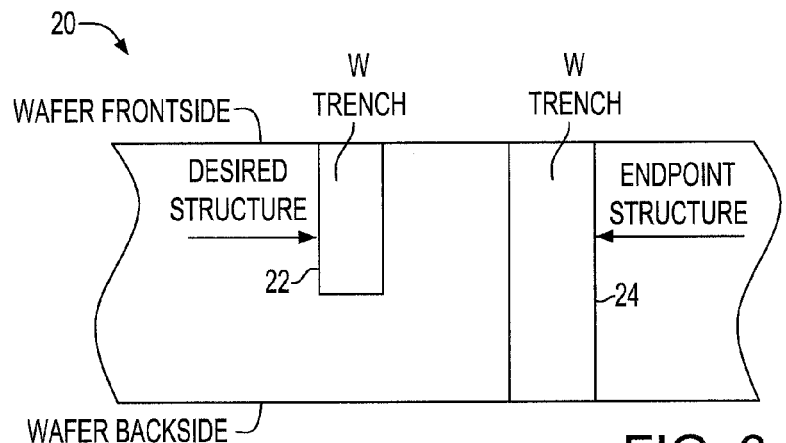
FIG. 3 illustrates a process for grinding the wafer.

In the above process, structures are formed in the wafer 20. Typically, these structures are part of the integrated circuits built up in the wafer. One such structure is shown at 22 in FIG. 3.

Also, as mentioned above, one significant problem with the fabrication process is that, during the backgrinding, the wafer 20 may be thinned too much, resulting in damage to internal structure, such as structures 22, formed in the wafer.

To prevent this, wafer 20 is provided with end point structure 24 to stop the thinning process before the desired structure is damaged. End point structure 24 is etched into the silicon in any suitable manner and, preferably, at the same time as the desired structure 22. The opening, in which the end point structure is formed, is at a constant, greater depth than the desired structure 22. Thus, the end point structure is at a constant, greater depth than the desired structure. The end point structure may be formed of any suitable material, such as W, Cu or any metal which, when in contact with the grinding wheel (which, for example, may be a 5 um diamond resin grind wheel) will stop the thinning process.

Figure 4:
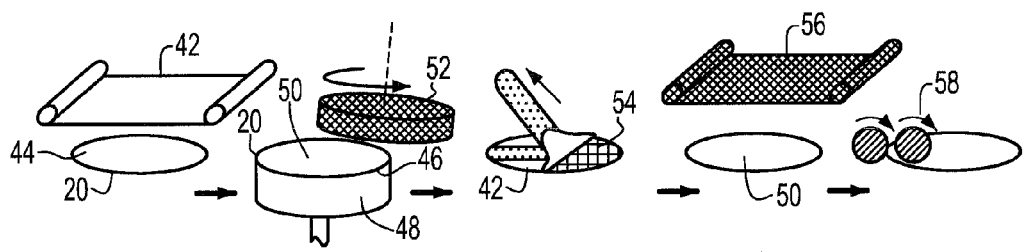
FIG. 4 shows an alternate wafer grinding procedure.

FIG. 4 illustrates one suitable grinding process in more detail. Backgrind tape or grinding protection tape 42 is first taped to the semiconductor wafer 20 to protect integrated circuits or other surface structures formed on an active or upper surface 44 of wafer. With the grinding protection tape attached to the upper surface of wafer, the wafer may then be mounted, face down, to a surface or platform 46 of vacuum chuck 48. The vacuum chuck may apply a suction or vacuum to hold wafer 20 and grinding protection tape 42, which is adhesively attached to the wafer, to the vacuum chuck. Once wafer 20 is suctioned face-down to vacuum chuck 48, the wafer may now be ready to be thinned by removing material from a back side or a lower surface 50 (untaped side) of the wafer by a grinding chuck 52.

After the grinding process, grinding protection tape 42 may be removed or de-taped from upper surface 54 of wafer 20. The wafer may then be mounted with a wafer mount tape 56 applied to lower surface 50 of the wafer. The wafer 20 may then be singulated or diced at 58 into separate integrated circuit die or a plurality of integrated circuit die.

Figure 5:
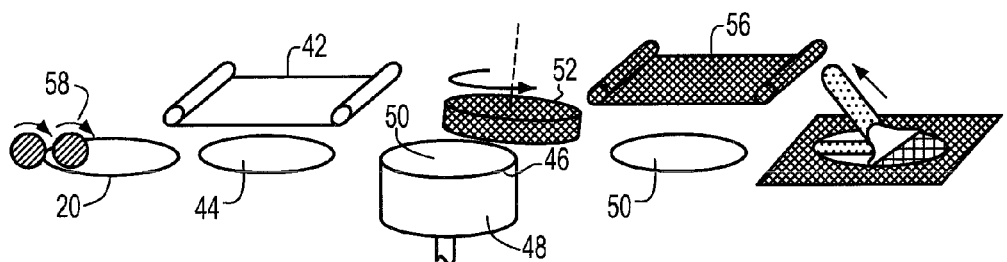
FIG. 5 is a partial, cross sectional view of the wafer of FIG. 2.

FIG. 5 shows a variation of the above-process. This variation, called dice-before-grind (DBG), moves dicing to the start of the process and eliminates the handling of very thin ground wafers as a whole. The wafer 20 may be diced at 58 to a depth slightly deeper than a final desired wafer thickness. Grinding protection tape 42 may be attached to upper surface 44 of the wafer. As in FIG. 4, wafer 20 may then be mounted, face down, to platform 46 of vacuum chuck 48 so that lower surface 50 may be thinned by grinding chuck 52. Then the lower surface of wafer may be mounted with wafer mount tape 56, and the grinding protection tape 42 may then be removed.

With both of the above-grinding processes, when the grinding reaches end structure 24, the grinding stops. This prevents the grinding from reaching desired structure 22.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of fabricating a semiconductor wafer, comprising the steps of:
   providing a silicon wafer having a front side and a back side;
   building an integrated circuit on the front side of the wafer;
   thereafter removing substrate from the back side of the silicon wafer;
   wherein the building step includes the steps of:
   forming a desired structure in the wafer;
   forming an end structure in the wafer, said end structure extending to a greater depth, toward the back side of the wafer, than the desired structure; and
   the removing step includes the step of removing said substrate only to the end structure and using said end structure to stop the removing step, whereby no part of the desired structure is removed during the removing step;
   wherein the removing step includes the further steps of:
   grinding away said substrate by using a grinding wheel; and
   stopping said grinding when the grinding wheel reaches said end structure, wherein the end structure is formed of a material that, when in contact with the grinding wheel, stops the grinding wheel.

2. A method according to claim 1, wherein said end structure is made of a material selected from the group consisting of tungsten and copper.

3. A method according to claim 1, wherein the end structure has a bottom end, and said bottom end is closer than the desired structure to the back side of the wafer.

* * * * *